United States Patent [19]
Costigan et al.

[11] Patent Number: 6,090,534
[45] Date of Patent: Jul. 18, 2000

[54] DEVICE AND METHOD OF DECREASING CIRCULAR DEFECTS AND CHARGE BUILDUP INTEGRATED CIRCUIT FABRICATION

[75] Inventors: John G. Costigan; David Huibregtse, both of Orlando, Fla.

[73] Assignee: Lucent Technologies Inc., Murray Hill, N.J.

[21] Appl. No.: 09/089,792

[22] Filed: Jun. 3, 1998

[51] Int. Cl.$^7$ ........................................................ G03F 7/32
[52] U.S. Cl. .......................... 430/329; 430/311; 430/322
[58] Field of Search .................................... 430/311, 322, 430/328, 329, 401

[56] References Cited

U.S. PATENT DOCUMENTS

| | | | |
|---|---|---|---|
| 4,557,986 | 12/1985 | Blais | 430/22 |
| 4,951,172 | 8/1990 | Steinman | 361/213 |
| 5,342,738 | 8/1994 | Ikeda | 430/325 |
| 5,740,488 | 4/1998 | Fujimoto | 396/604 |
| 5,777,209 | 7/1998 | Tien | 73/40.7 |
| 5,826,130 | 10/1998 | Tanaka | 396/611 |
| 5,866,303 | 2/1999 | Azuma | 430/325 |

*Primary Examiner*—Sharon Gibson
*Assistant Examiner*—Nicole Barreca

[57] ABSTRACT

The present invention provides, an apparatus and method for decreasing circular defects and charge buildup on a semiconductor wafer having a photoresist formed thereon. In one embodiment, the method comprises the steps of positioning a semiconductor wafer in a track developer, applying a photoresist developer to a first side the semiconductor at a predetermined speed. That initial speed is then increased to a speed that ranges from about 400 rpm to 800 rpm. The photoresist is rinsed from the semiconductor while a back spray is applied to a second side of the semiconductor during the rinsing. Additionally, the semiconductor wafer is subjected to a flow of ions from an ionization source within the tracking device itself. The ionization within the tracking device is one advantageous aspect over prior art systems because the substantial direct flow of ions within the tracking device reduced the charge buildup associated with the increased spin speeds.

12 Claims, 2 Drawing Sheets

DEVICE AND METHOD OF DECREASING CIRCULAR DEFECTS AND CHARGE BUILDUP INTEGRATED CIRCUIT FABRICATION

TECHNICAL FIELD OF THE INVENTION

The present invention is directed, in general, to a device and method of integrated circuit fabrication and, more specifically, to a device and method of decreasing circular defects and charge buildup in integrated circuit fabrication processes.

BACKGROUND OF THE INVENTION

Since the first integrated circuit, there has been an ever increasing density of devices manufacturable on semiconductor substrates and a corresponding decrease in the size of the integrated circuits. While these advancements have provided better production yields and faster integrated circuits, they have been accompanied by a more complex fabrication process where the size and density make the integrated circuits easily affected by contaminants and process variables.

Well accepted process techniques for fabricating an integrated circuit involves the use of patterning the semiconductor wafer at various levels. These patterns correspond to device regions, or interconnect structures, and such patterns are sequentially transferred to the wafer through well known lithographic processes. The result of each process is a set of features created on the wafer surface. This process can be repeated creating different formations on the wafer or other films and substrates can be applied interconnecting various features until the desire structural configuration is achieved.

The lithographic transfer process begins where layers of photoresist materials are first spin-coated onto the wafer substrate, and then selectively exposed to a form of radiation, such as ultraviolet light. A developer is introduced to the resist which removes parts of the layer made soluble or insoluble by exposure. The patterns in the resist are formed during this "development" step. The areas of resist remaining after development, protect the substrate regions which they cover. Locations from which the resist has been removed can be subjected to a variety of additive (e.g. lift-off) or subtractive (e.g. etching) processes that transfer the pattern onto the substrate surface.

Often, the development step is broken down into four intervals: application, puddle, rinse and dry. During these stages, with the exception of the puddle stage, the wafer is rotating to allow an even distribution of the applied liquid, developer or water rinse. The wafer does not rotate during the puddle interval, allowing the developer to dissolve the soluble portions of the photoresist. Commonly, during the drying interval, the wafer rotates at a higher rate than during the other intervals to remove all liquid. For a better understanding of integrated circuit fabrication, in general, see *Silicon Processing for the VLSI Era*, Volume 1: *Process Technology*, by S. Wolf and R. N. Tauber, Lattice Press (1986), which is incorporated herein by reference.

Unfortunately, various problems occur during the fabrication of silicon wafer integrated circuits. One such problem is circular defects, which is a surface imperfection which inhibits chemical etching, and arises from the rinse-related step during the post-development step. During the post-development step, the developer is dissolved and the photoresist is rinsed off the wafer surface allowing access to the substrate below. Problems arise where water, containing developer and resist, is not completely rinsed off the wafer. This solution, containing particulate remains of resist, could land on the exposed silicon substrate where drilling (i.e. etching) was to occur. Subsequently, the etching cannot take place and that portion of the wafer may be unusable, which can substantially affect the production yield, thereby decreasing overall fabrication efficiency and increasing production costs.

Another problem which occurs is the buildup of electrostatic charges in the wafer during fabrication. More specifically, charges will often buildup in films on the semiconductor wafer while the wafer is spinning during various track processes. Charges of this nature, measured in volts per inch, can be extremely destructive to the structures within the wafer. Specifically, these gate oxides, measured in microns, can literally be broken down by these static discharges; a result that is highly undesirable. Commonly, a known manner of attempting to alleviate random electrostatic charges includes placing deionizaton bars that produce constant flows of charged ions within the fabrication clean room itself. However, because the clean rooms are typically large, the flow of charge ions often does not reach the device to adequately de-ionize it.

Accordingly, what is needed in the art is a method of semiconductor fabrication which reduces the occurrence of circular defects and electrostatic charge buildup on a semiconductor wafer.

SUMMARY OF THE INVENTION

The industry and the prior art recognize the problems associated with circular defects and electrostatic charge buildups on semiconductor wafers. Unfortunately, these problems have not been addressed simultaneously. In order to supply a solution to these dilemmas, the present invention consists of a new method and a new device for decreasing the occurrence of circular defects and electrostatic charge buildup on a semiconductor wafer, which includes a layer of formed photoresist.

Initially, the method consists of placing the semiconductor wafer in a track developer that has a internal ionization source, such as a deionization bar. Once inside the track developer, a liquid photoresist developer is applied to the top of a wafer covered with photoresist, the wafer being rotated at a predetermined speed. After applying the photoresist developer, the rotational speed of the wafer is altered to allow dispensed liquid to rinse the remaining photoresist from the surface of the wafer. During this rinse, a back spray is applied to the bottom surface of the semiconductor wafer to insure that none of the photoresist developer remains. As a result of altering the rotational speed during the rinse cycle, the circular defects exhibited on the wafer are reduced.

When the rotational speeds are increased and the bottom of the wafer is sprayed by the back sprayer during the rinse, electro-static charges quickly buildup on the surface of the wafer. To reduce this destructive charge, the entire track developer is continually flooded with positive or negative ions from the deionization bar. This continual flow of charged ions has been found to substantially reduce the electro-static charge resulting during the wafer fabrication process.

In addition to the method included in the present invention, an device employing the above method is provided. The device includes a track developer that is made up of a housing, a shaft, a spin chuck, a topside rinse nozzle that is capable of dispensing a fluid onto a semiconductor wafer and a deionization bar, which coupled to and positioned within the housing. Ions dispersed from the deionization bar positioned within the housing have been found to greatly reduce the electro-static charges resulting on the semiconductor wafer surface.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following description taken in conjunction with the accompanying drawing, in which.

DETAILED DESCRIPTION

Figure 1A:
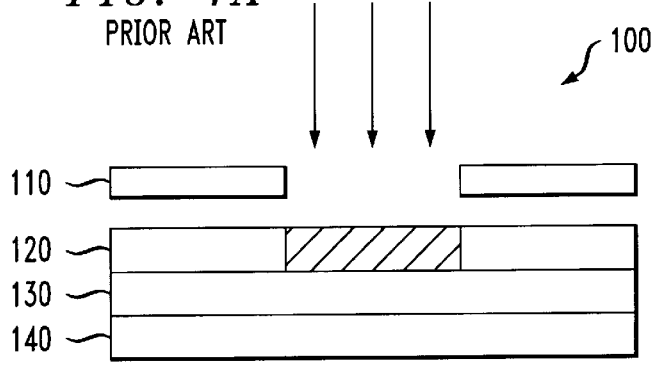
FIGS. 1A–1B illustrate various well known stages of integrated circuit wafer fabrication utilizing lithography in a track developer.
Figure 1B:
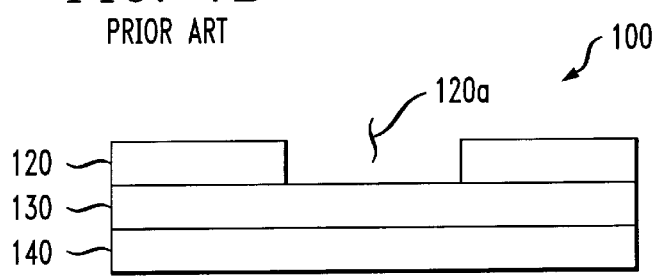

Referring initially to FIGS. 1A–1C, illustrated are various stages of a conventional fabrication process of an integrated circuit wafer 100. FIG. 1A shows an elevational view of a wafer 100 during the radiation exposure interval, and consists of a silicon substrate 140, upon which is layered a silicon oxide substrate 130. The silicon oxide layer 130 is further coated with a film of photoresist 120. The photoresist 120 is exposed to a radiation source, indicated by the arrows, through a mask 110. The radiation exposes the uncovered portion of the photoresist 120, which is indicated by cross-hatching.

FIG. 1B illustrates the wafer 100 after the developer is removed in a rinsing step that occurs within a track developer. At this point, the desired portions of the photoresist 120 have been removed and forms the opening 120a in the photoresist 120, allowing access to the silicon oxide layer 130 residing below. In conventional processes, it is during the rinse step that a photoresist residue may remain on certain portions of the semiconductor wafer 100. The photoresist residue may partially cover a portion of the opening 120a, which can prevent subsequent normal etching processes to proceed into the silicon dioxide layer 130.

Figure 2A:
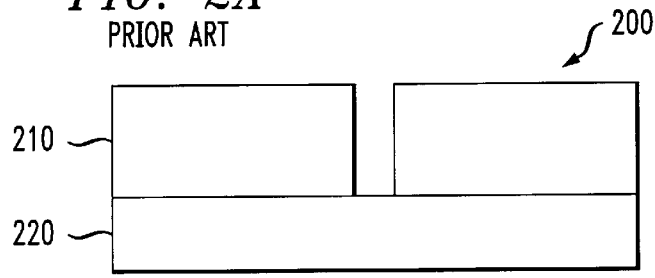
FIGS. 2A–2C illustrate stages of silicon oxide etching and the resulting circular defects.
Figure 2B:
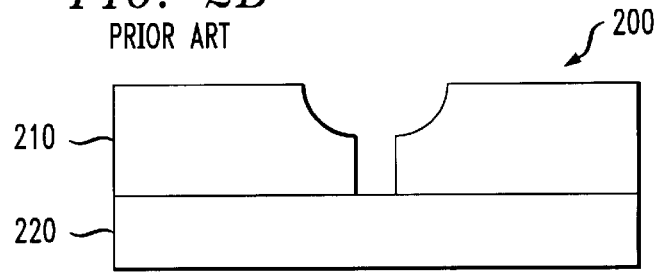
Figure 2C:
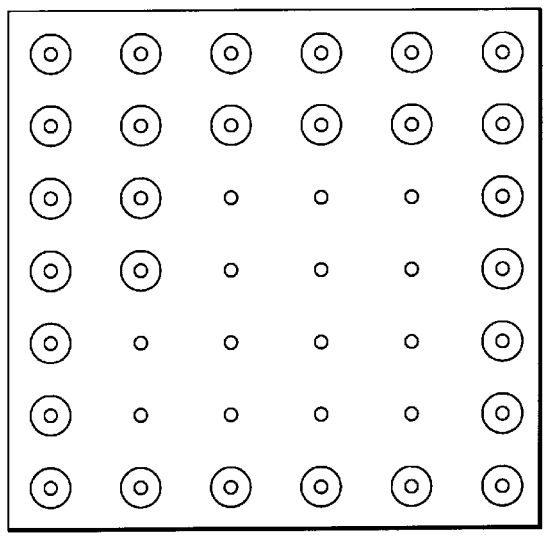

Turning now to FIGS. 2A–2C, illustrated are the stages of silicon oxide etching and the resulting circular defects caused by the photoresist residue. FIG. 2A depicts an elevational view of a semiconductor wafer 200 immediately following a first silicon oxide etch that has been unaffected by any photoresist residue. This view shows only the silicon oxide 210 and silicon 220 substrates following the thorough removal of the photoresist via exposure and development. The silicon oxide 210 has been etched (ie. drilled) using a plasma etch process.

FIG. 2B shows the wafer 200 immediately following a conventional second etching, which has also been unaffected by any photoresist residue. The second etch is commonly referred to as "dishing-out" the strata and the techniques used to form this dished out area are well known in the art. It is during the second etch that circular defects most commonly occur because of the affected photoresist residue. The photoresist residue causes the second etch to be blocked, thus comprising an increase in circular defects.

FIG. 2C is a graphical representation of circular defects on the semiconductor wafer 200 resulting from improper rinsing of the remaining developer containing dissolved photoresist. In this example, a substantial portion of the dishing-out etches were unsuccessful, which made that portion of the wafer 200 potentially unusable and which lowered the wafer yield.

To remedy the above-discussed problems, the present invention is directed to a method and apparatus for substantially reducing the circular defects associated with conventional processes. It has been unexpectedly found that the spin speeds during the rinsing phase are related to the number of circular defects. More specifically, it has been found that spin speeds substantially faster than those commonly used in the industry can reduce the number of circular defects. As is well known these spin speeds typically occur in various track developers through which the semiconductor wafer is passed during the fabrication process.

These track developers are well known and commonly used in various phases of the semiconductor wafer fabrication process. A coater is generally used to spray a liquid film of photoresist on the semiconductor wafer while spinning at around 400 rpm. After application and exposure, the photoresist is developed and rinsed off the semiconductor wafer in a track developer. If impurities contaminate the surface of the wafer during the fabrication process, the semiconductor wafer is placed in a scrubber in which the impurities are literally scrubbed from the surface of the wafer.

Figure 3:
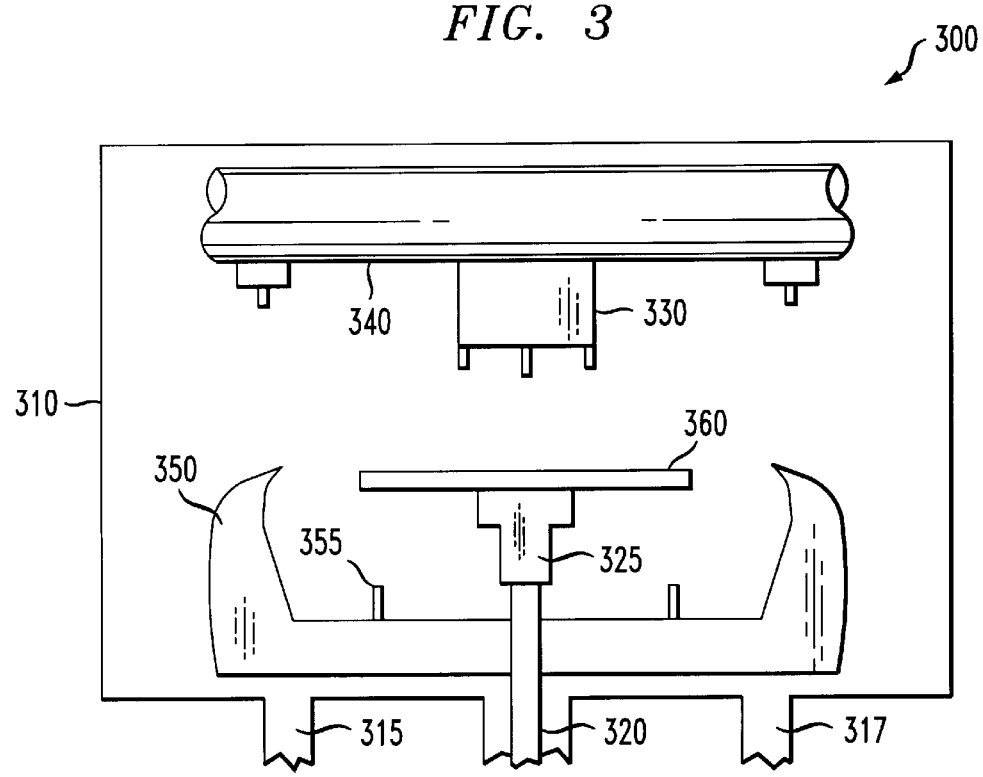
FIG. 3 illustrates a schematic diagram of an embodiment of a track developer constructed according to the principles of the present invention.

Turning now to FIG. 3, illustrated is a schematic diagram of a track developer 300 used in semiconductor wafer fabrication. The track developer 300 includes a housing 310 that contains a drain 315 and an exhaust 317 to evacuate liquids and gasses used and produced during the fabrication process. A shaft 320 that has a first end coupled to a motor (not shown) also has a second end that extends into the housing 310. The second end of the shaft 320 is coupled to a spin chuck 325. The spin chuck 325 further consists of a spin cup 350 comprising an upper cup ring and a baffle disk. The spin chuck 325 is surrounded by the spin cup. A topside rinse nozzle 330 is positioned in the housing 310 so that fluid may be dispensed onto a first surface of the semiconductor wafer 360. A deionization bar 340 is also uniquely provided in the housing 310. The deionization bar 340 is attached to the housing 310 in such a way as to position it over the spin cup 350 so that a flow of ions generated from the bar may diffuse throughout the housing 310 and directly onto the semiconductor wafer. The flow of ions originating from the deionization bar alternates between emitting positive and negative ions. Additionally, coupled to the housing is a back side rinse nozzle 355 positioned to dispense fluid onto the second surface of the semiconductor wafer 360.

The operation of the track developer 300 can be described in four intervals: application, puddle, rinse and dry. Application begins when a semiconductor wafer 360 is placed on the spin chuck 325. The spin chuck 325 is rotated up to a speed of 700 rpm or less. Once the wafer has reached a designated rotational speed, the photoresist developer is applied to the first side of the semiconductor wafer 360 for approximately 5 seconds. After developer application, the rotational speed is substantially reduced, in some cases to 0 rpm, for approximately 55 seconds. This speed reduction allows the developer to puddle on the semiconductor wafer 360. The wafer rotation is once again increased for the rinse interval to a speed between 400 rpm to 800 rpm. At this point, roughly 20 seconds, the excess photoresist and puddled developer are rinsed away from both surfaces of the semiconductor wafer 360 with liquid, usually deionized water, dispensed from the topside rinse nozzle 330 and the back side rinse nozzle 355. After the rinse interval, both nozzles 330, 355 are turned off and the rotational speed is yet again increased. During this 10 second interval, centrifugal forces, resulting from the great rotational speed, remove rinse liquid from the surfaces, thus drying the semiconductor wafer 360.

Once the circular defects were determined to be a result of improper rinse procedures, experimentation led to the discovery that increasing the rotational speed during the rinse phase greatly reduced such occurrences. One aspect of the present invention is, therefore, directed to speeds that range from about 400 rpm to about 800 rpm.

A new problem arose when the solution to the circular defects problem presented itself; that problem was electrostatic charge buildup (ECB). It was observed that as the wafer speed was increased, the buildup, measured in volts per inch, greatly increased. Additionally, it was also observed that when the back side rinse nozzle 355 was not on at the same time as the topside rinse nozzle 330, the ECB was larger. However, when both the topside rinse nozzle 330 and the back side rinse nozzle 355 were on during the rinse interval, the charge would remain small. When the topside rinse nozzle 330 was turned off, but the backside rinse nozzle 355 remained in use, the ECB would increase dramatically. The subsequent drying stage would also show an even higher ECB than the rinse stage. To combat this obstacle, a deionization bar 340 was added to the track developer 300. The alternating flow of positive and negative ions, introduced prior to the developer application, effectively reduced the ECB on the track developer 300.

From the foregoing it is apparent that the present invention provides a method for decreasing circular defects and charge buildup on a semiconductor wafer having a photoresist formed thereon. In one embodiment, the method comprises the steps of positioning a semiconductor wafer in a track developer, applying a photoresist developer to a first side of the semiconductor at a speed that ranges from about 300 rpm to about 700 rpm, increasing the speed of the semiconductor wafer to a speed between 400 rpm to 800 rpm and rinsing the photoresist from the semiconductor during the increased speed, applying a back spray to a second side of the semiconductor during the rinsing, and subjecting the semiconductor wafer and the spin cup to a flow of ions from an ionization source within the tracking device. The ionization within the tracking device is one advantageous aspect over prior art systems. The increased spin speeds, build up substantial charge on the semiconductor wafer, which requires a substantially direct flow of ions onto the wafer during the fabrication process and within the tracking device. In one particular embodiment, the ionization source is a deionization bar positioned within the track developer itself. The deionization bar is capable of alternating the ion flow from positive ions to negative ions in a continuous cycle during the fabrication process.

Generic, track developers are common and well known within the art. However, tracks having a deionization bar contained therein, such as those covered by the present invention, are not presently available. Tracks of this nature are able to function as photoresist developers, scrubbers for cleaning semiconductor wafers and coaters capable of dispensing photoresist onto the wafer surface.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device comprising the steps of:

positioning a semiconductor wafer in a track developer;

applying a photoresist developer to an exposed photoresist located on a first side of said semiconductor wafer, while rotating said semiconductor wafer at a predetermined speed;

increasing said predetermined speed to a speed ranging from about 400 rpm to about 800 rpm, and rinsing said photoresist from said semiconductor wafer at an increased speed;

applying a back spray to a second side of said semiconductor wafer during said rinsing; and subjecting said semiconductor wafer to a flow of ions from an ionization source within said track developer to reduce a charge build up on said semiconductor wafer.

2. The method as recited in claim 1 wherein said applying a photoresist developer includes the steps of applying said photoresist developer for approximately 5 seconds at speeds that range from about 700 rpm to about 300 rpm and substantially decreasing said predetermined speed such that said photoresist developer puddles on said semiconductor wafer for approximately 55 seconds.

3. The method as recited in claim 1 wherein said rinsing includes rinsing said semiconductor wafer for approximately 30 seconds.

4. The method as recited in claim 1 wherein said applying said back spray includes applying said back spray for approximately 20 seconds.

5. The method as recited in claim 1 wherein said method further comprises the step of spin drying said semiconductor wafer for approximately 10 seconds at a speed of about 5000 rpm.

6. The method as recited in claim 1 wherein said subjecting includes the step of subjecting said semiconductor wafer to said flow of ions to reduce a charge build up on said semiconductor wafer, prior to the step of applying said photoresist developer.

7. The method as recited in claim 1 wherein said applying a back spray includes the step of applying deionized water to said second side of said semiconductor wafer.

8. The method as recited in claim 1 wherein said subjecting includes alternating said flow of ions from positive ions to negative ions.

9. A method for decreasing circular defects and charge buildup on a semiconductor wafer having a photoresist formed thereon, comprising the steps of:

positioning a semiconductor wafer in a track developer;

applying a photoresist developer to an exposed photoresist located on a first side of said semiconductor wafer, for approximately 5 seconds at speeds that range from about 700 rpm to about 300 rpm and substantially decreasing said speeds such that said photoresist developer puddles on said semiconductor wafer for approximately 55 seconds;

increasing said speeds of said semiconductor wafer to a rinsing speed that ranges from about 400 rpm to about 800 rpm and rinsing said photoresist from said semiconductor wafer at said rinsing speed;

applying a back spray to a second side of said semiconductor wafer during said rinsing; and subjecting said semiconductor wafer to a flow of ions from an ionization source within said track developer to reduce a charge build up on said semiconductor wafer.

10. The method as recited in claim 9 wherein said rinsing includes rinsing said semiconductor wafer for approximately 20 seconds and applying said back spray includes applying said back spray for approximately 20 seconds.

11. The method as recited in claim 9 wherein said method further comprises spin drying said semiconductor wafer for approximately 10 seconds at a drying speed of about 5000 rpm.

12. The method as recited in claim 9 wherein said subjecting includes subjecting said semiconductor wafer to said flow of ions prior to applying said photoresist developer.

* * * * *